United States Patent [19]
Bustance et al.

[11] Patent Number: 5,148,169
[45] Date of Patent: Sep. 15, 1992

[54] METHOD AND APPARATUS FOR CONVERSION OF THE SAMPLED SIGNAL OF AN ANALOG INPUT SIGNAL

[75] Inventors: C. David Bustance; Paul Lidbetter, both of Royston; John Lancaster, Fulbourn, all of Great Britain

[73] Assignee: Siemens Aktiengesellschaft Österreich, Austria

[21] Appl. No.: 663,844

[22] Filed: May 20, 1991

[30] Foreign Application Priority Data

Sep. 29, 1988 [EP] European Pat. Off. ........ 88309066.4

[51] Int. Cl.5 ..................... H03M 1/14; H03M 1/68
[52] U.S. Cl. ..................... 341/156; 341/145
[58] Field of Search ............ 341/156, 145, 144, 155, 341/110, 126

[56] References Cited

U.S. PATENT DOCUMENTS

| | | | |
|---|---|---|---|
| 3,710,377 | 1/1973 | Guillen et al. | 341/156 |
| 4,410,876 | 10/1983 | Sawagata | 341/156 X |
| 4,544,917 | 10/1985 | Lenhoff, Jr. | |
| 4,875,048 | 10/1989 | Shimizu et al. | 341/156 |
| 4,973,974 | 11/1990 | Suzuki | 341/156 X |

FOREIGN PATENT DOCUMENTS

| | | |
|---|---|---|
| 1801670 | 3/1971 | Fed. Rep. of Germany . |
| 2026643 | 12/1971 | Fed. Rep. of Germany . |
| 2179812 | 3/1987 | United Kingdom . |

OTHER PUBLICATIONS

Electronic Design, Jan. 22, 1987, vol. 35, No. 2, pp. 119-122: *Comparing ADC Architectures is a Designer's Best Bet*, Hasbrouck Heights, N.J., USA.
Funkschau, No. 7, Mar. 1983, München, Germany, pp. 57-60: Video in Bits.
L. M. Radhakrishanan: "Two 8 bit DAC's Make a 12 Bit DAC", Electronic Engineering, Aug. 1985, vol. 57, No. 704.

*Primary Examiner*—Sharon D. Logan
*Attorney, Agent, or Firm*—Kenyon & Kenyon

[57] ABSTRACT

A method for converting a sampled signal of an analog input signal to a digital output signal that is L data bits in length is provided. The method includes the steps of: a) converting the sampled signal to a digital reference signal of $M<L$ data bits in length only during a sampling period that is a portion of a work cycle; b) maintaining the digital reference signal until a subsequent sampling period; c) converting the digital reference signal back to an analog reference signal; d) subtracting the analog reference signal from the sampled signal to form a difference signal but suppressing the subtracting step if a level of the sampled signal falls below a minimum quantization level for converting the sampled signal to a digital reference signal; e) amplifying and converting the difference signal to a digital partial signal of N data bits in length, where $M<N<L$; and f) summing the digital reference signal and the digital partial signal to yield the digital output signal having L data bits, the output signal having most significant bits formed by the digital reference signal and least significant bits formed by the digital partial signal, wherein a sum of a number of data bits of the digital reference signal and the partial signal is not less than a number of data bits of the digital output signal.

5 Claims, 1 Drawing Sheet

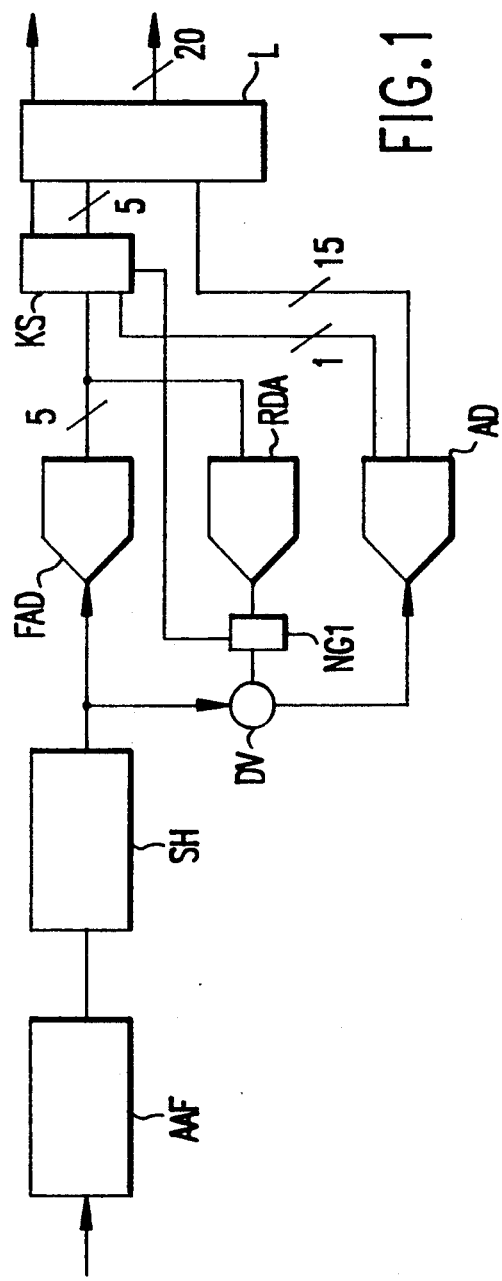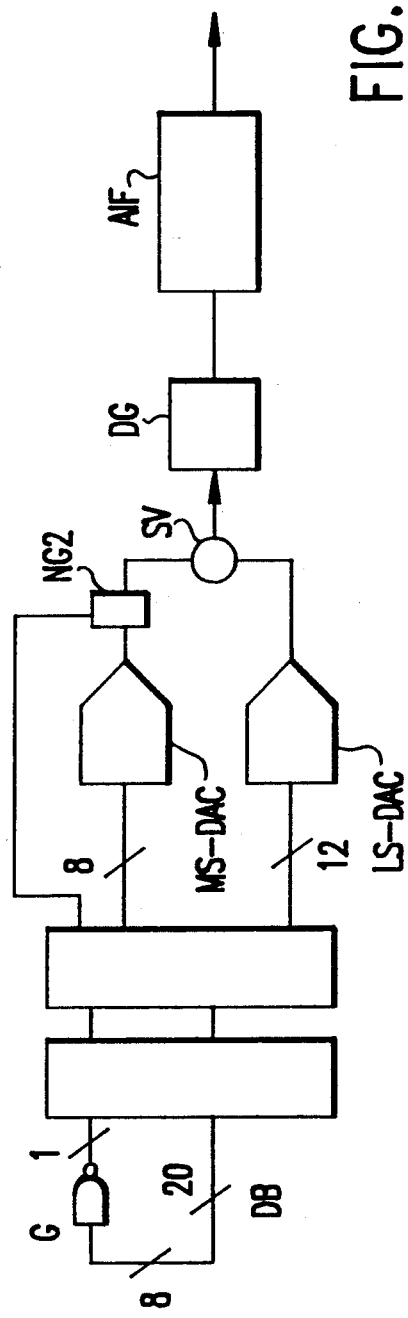

METHOD AND APPARATUS FOR CONVERSION OF THE SAMPLED SIGNAL OF AN ANALOG INPUT SIGNAL

BACKGROUND OF THE INVENTION

The present invention relates generally to a method and apparatus for converting a sampled signal of an analog input signal to a digital output signal.

Such a method for converting a sampled signal to a digital output value of L data bits includes the steps of converting the sampled signal to a digital reference value of $M<L$ data bits in length. The digital reference value is in turn converted back to an analog reference signal and subtracted from the sampled signal The resulting difference signal is amplified and converted to a digital partial value of $M<N<L$ data bits in length. This digital partial value is summed with the reference value to yield the output value having L data bits. The higher-value data bits of the output value is formed by the reference value and the lower-value data bits of the output value is formed by the partial value. The sum of the number of data bits of the reference value and the partial value is not less than the number of data bits of the output value.

Analog/digital converters are disclosed in *Electronic Design*, Volume 35, pp. 119-122, "Comparing ADC architectures is a designer's best bet" and *Funkschau*, No. 7, Page 57-60, "Video in Bits". These converters function according to the above-described method (i.e. subranging technique). By dividing the conversion process into the formation of a reference value and a partial value, a total resolution is obtained, after the two values are brought together, which is greater than the partial resolution in each case. In this method, the reference value is a first approximation of the output value. The difference signal contains the data which is below the resolution limit of the reference value. Funkschau, No. 7 discusses problems and errors which can occur in this type of analog/digital conversion method. For example, in sound studios, these errors result in audible interference.

DE-A-2 026 643 discloses an analog/digital converter that uses a subranging method. A first digital partial result (i.e. a reference value) is first formed and stored from an electrical analog input value by an analog/digital converter of relatively low accuracy. This partial result is converted back by a digital/analog converter with the full, desired accuracy. From this partial result the difference to the input value is formed. Finally, after amplification of this difference value, a second digital partial result is obtained, which is brought together with the first partial result in a result register to form the output value. A similar analog/digital converter is also disclosed in DE-A 1 801 670.

The problem with the prior art is that interference occurs during the formation of the difference signal.

SUMMARY OF THE INVENTION

The present invention provides method for converting a sampled signal of an analog input signal to a digital output signal that is L data bits in length. The method includes the steps of: a) converting the sampled signal to a digital reference signal of $M<L$ data bits in length only during a sampling period that is a portion of a work cycle; b) maintaining the digital reference signal until a subsequent sampling period; c) converting the digital reference signal back to an analog reference signal; d) subtracting the analog reference signal from the sampled signal to form a difference signal but suppressing the subtracting step if a level of the sampled signal falls below a minimum quantization level for converting the sampled signal to a digital reference signal; e) amplifying and converting the difference signal to a digital partial signal of N data bits in length, where $M<N<L$; and f) summing the digital reference signal and the digital partial signal to yield the digital output signal having L data bits, the output signal having most significant bits formed by the digital reference signal and least significant bits formed by the digital partial signal, wherein a sum of a number of data bits of the digital reference signal and the partial signal is not less than a number of data bits of the digital output signal.

In the present invention, the reference value is only formed during a sampling period as part of a work cycle. The reference value is held until the subsequent sampling period. The subtraction of the reference signal is suppressed if the level of the sampled signal drops below the minimum quantization level for reference value formation.

The data contained in the difference signal, from the range of low input levels, is converted with high resolution and good linearity. Furthermore, since the partial value is shifted downward during the formation of the output value, all errors in the formation of the partial value are lowered in relation to the output value. Voltage peaks occurring during the formation of the difference signal, which are due to transit time differences between the sampled signal and the reference signal, are reduced to such an extent that they no longer cause interference. The voltage peaks are reduced because of the division of the work cycle. Furthermore, a temporary memory at the converter output is no longer necessary with this method of operation. The difference between the reference signal and the sampled signal is only allowed to become great enough so that the subsequent amplifier does not go into the saturation range.

For optimum utilization of the components that are used, it is advantageous that the sum of the data bits of the reference value and the partial value is not significantly greater than the number of data bits of the output value. It is also advantageous that the excess data bits are used to correct conversion errors as well as to indicate that the value range was exceeded. Because of the overlap of the reference value with the partial value it is possible to eliminate the errors in the formation of the reference value with the highest bit of the partial value.

In the digital/analog converter disclosed in *Electronic Engineering*, Volume 57, No. 704, August 1985 (London, GB), L. M. Radhakrishnan: "Two 8 bit DAC's make a 12 bit DAC", p. 30, the level adjustment takes place only via a resistor. Audible errors can occur when using components with low resolution.

The invention also relates to a method for converting a digital input signal having most significant and least significant bits to an analog output signal. The method comprises the steps of: a) dividing the digital input signal into two partial values, the most significant bits forming a higher partial value and the least significant bits forming a lower partial value; b) shifting the lower partial value downward several bits to achieve a first portion of a level adjustment; c) converting simultaneously the higher and lower partial values to higher and lower analog partial signals, respectively, the higher partial value having a first number of bits and the lower partial value having a second number of bits, the first number of bits being less than the second number of bits; d) attenuating the lower partial signal to achieve a remaining portion of the level adjustment with respect to the higher partial signal; e) adding a fixed digital signal to the digital input signal and attenuating the higher partial signal to a corresponding degree if the digital input signal is less than the digital fixed signal; and f) summing the lower and higher partial signals to form the analog output signal. As a result, the present invention advantageously converts a digital input value to an analog output signal while avoiding interference in the formation of the sum signal.

Both temperature variations in the current-voltage conversion for forming the partial signal and summation and the aging of the components used trigger audible distortions in signals at a lower level. These distortions are eliminated in the present invention. An uncoupling of the voltage zero pause of the converter from the bipolar zero point of the input value occurs. Furthermore, the noise level during conversion is also reduced in this way.

A device for analog/digital conversion can be manufactured with generally available components. According to another aspect of the invention, an apparatus for analog to digital conversion is provided. The apparatus includes a sampling and holding element that has an output and an input for receiving an input signal. An M-bit parallel A/D converter has an analog input coupled to the output of the sampling and holding element. A reference D/A converter has digital inputs coupled to outputs of the parallel A/D converter. An L-bit bistable temporary memory, where M<L, has high-value inputs coupled to the outputs of the parallel A/D converter. A difference amplifier coupled to an output of the reference D/A converter and coupled to the output of the sampling and holding element. An N-bit partial value A/D converter, where M<N<L, has an analog input coupled to an output of the difference amplifier, outputs coupled to low-value inputs of the temporary memory, as well as a highest-value output. A correction circuit has inputs coupled to the outputs of the M-bit parallel A/D converter and an additional input coupled to the highest-value output of the partial value A/D converter. The correction circuit also has outputs coupled to the high-value inputs of the temporary memory and an overload output coupled to another input of the temporary memory. A first noise suppression circuit is coupled to a control output of the correction circuit. The first noise suppression circuit is coupled to the reference D/A converter and the difference amplifier to suppress a reference signal when a level of the sampled signal is below a minimum quantization level for forming the reference signal.

Due to the rapid operation of the parallel A/D converter, the transit time difference between the sampled signal and the reference signal is kept at a minimum. This converter holds the previous sampling value until the next period. Issuance of the overload value replaces an analog overload display. In this circuit arrangement, no special balancing of the individual modules is necessary.

For digital/analog conversion with generally available components, it is advantageous to provide an apparatus for digital to analog conversion that includes a data bus for receiving a digital input signal which has highest-value lines. A low-value and a high-value D/A converter are coupled to the data bus. The low-value and high-value D/A converters each have an output. A summation amplifier is coupled to the output of the low-value D/A converter and to the output of the high-value D/A converter. A noise suppression circuit is coupled to the output of the high-value D/A converter and is also coupled to the summation amplifier. A gate is coupled to the noise suppression circuit and the highest-value lines of the data bus for adding a digital fixed signal. A transmission memory and an input memory are serially coupled together. The input memory is coupled to the data bus and the transmission memory has high-value outputs coupled to the high-value D/A converter. The transmission memory also has low-value outputs coupled to the low-value D/A converter. This configuration ensures that in a multi-channel audio system, all channels take over the input values at the same time, and no phase errors occur.

BRIEF DESCRIPTION OF THE DRAWINGS

FIG. 1 shows a block diagram of the analog/digital converter module constructed according to the principles of the invention; and FIG. 2 shows a block diagram of the digital/analog converter module constructed according to the principles of the invention.

DETAILED DESCRIPTION

FIG. 1 shows a block diagram of a 20-bit analog/digital converter module for an audio channel of a digital studio mixing console which is a linear converter. An analog audio signal is applied to the input of an echo filter AAF, which limits the audio frequency to a maximum of 20 kHz. This filter suppresses higher frequencies which could become audible after conversion. Using this signal, the sampling holder element SH generates a pulse amplitude modulated signal sampled at 48 kHz having discrete direct voltage values, which is converted to a digital output value in two parallel steps.

A fast 5-bit parallel A/D converter FAD generates a digital 5-bit approximation of the sampled signal. This reference value is passed to a temporary memory L as part of the output value. Also, the reference value is connected to the most significant bit inputs of a 16-bit reference D/A converter RDA and converted back to an analog reference signal and then subtracted from the sampled signal by a difference amplifier DV. This difference signal is amplified by a factor of 16 and passed to a 16-bit partial value A/D converter AD. The most significant bit of the partial value is passed to a correction circuit KS and used as a digital superimposition value for the correction of errors in the formation of the reference value of the parallel A/D converter FAD. It is added to the 5-bit reference value, which together with the partial value forms the 20-bit output value of the analog audio signal. In the temporary memory L, the reference value, which is the most significant part and the remaining 15 bits of the partial value, which is the least significant part of the output value, are brought together.

If an audio signal is below the minimum quantization level of the parallel A/D converter FAD, the formation of the reference signal is suppressed. In this case, the amplification factor of the difference amplifier DV is 32. The signal level at the input of the partial value A/D converter is always 30 dB higher than at the input of the entire module. In the formation of the output value, the partial value is then shifted 30 dB downwards. As a consequence, all errors of the partial value A/D converter AD which occur during conversion are lowered by 30 dB. This results in a very good 20-bit linearity of the output value, the level of which is more than 30 dB below the maximum value. This range is of special importance for audio signals, since errors would be clearly audible. The only limit on the overall accuracy of the analog/digital conversion for sampled signals above the minimum quantization level of the parallel A/D converter FAD, when using the correction circuit KS, is the accuracy of the reference D/A converter RDA.

The echo filter AAF includes of an operational amplifier (e.g. ½ NC 5532), a Butterworth low-pass filter of the 4th order and a passive filter of the 1st order. This reduces the broad band noise and the phase dispersion of the filters. In the sampling holder element SH, the insulation between the sampled signal and the holding capacitors is improved by two dual field effect transistors (e.g. $2 \times N$ 5911). The discharge of the holding capacitors is prevented by integration with an operational amplifier (e.g. LF 356).

The parallel A/D converter FAD is unipolar and is of type MP 7682. It has a resolution of 6 bits and is switched to 5 bits. The output voltage of the sampling holder element SH is suitably adapted by resistors. The parallel A/D converter FAD is operated in a partial mode. During a work cycle it is cycled at 3.072 MHz only during the sampling period of the sampling holder element SH, and otherwise remains in operating readiness (i.e. stand-by) until the next subsequent sampling period. The last value at the converter output is held until the next cycle pulse sequence.

To achieve high accuracy, a 14-bit converter (e.g. ADG 7538) is used as the reference D/A converter RDA and is switched in such a way that it functions as a 5-bit converter. This converter essentially determines the accuracy of the output value of the entire module. To reduce noise, the current output is used instead of the voltage output, and the voltage signal is generated by two low-noise operational amplifiers. The 5 output bits of the parallel A/D converter FAD are sent to the 5 most significant bit inputs of the reference D/A converter RDA. A first noise suppression circuit NG1, which includes a field effect transistor (e.g. 3 110) and a resistor (e.g. 200 Ohm), is coupled with the reference D/A converter RDA as a voltage divider. It lowers the reference voltage by about 26 dB, if no valid value is applied to the input of the reference D/A converter RDA. A valid value at the output of the parallel A/D converter FAD causes the field effect transistor to be shut off, and the output of the reference D/A converter RDA is coupled to the difference amplifier DV.

The difference amplifier DV includes an operational amplifier (e.g. NE 5534), which is operated so that it is inverting to virtual ground. The nominal voltage amplification factor is 4. The sampled signal at the output of the sampling holder element SH is mixed with the inverted reference signal. The partial value is formed by the partial value A/D converter from this difference signal. A delay between the sampled signal and the reference signal at the input of the difference amplifier DV may generate voltage peaks. With high-frequency audio signals, in particular, severe harmonic distortions would then result. In order to solve this problem, the output of the difference amplifier could be shut off by an analog switch until the difference signal is stable. However, an additional operational amplifier would be necessary to adjust the impedance of this analog switch to that of the partial value A/D converter AD. In this embodiment, the transit time differences and the voltage peaks resulting therefrom are already reduced to a level at which they no longer cause interference because the reference D/A converter RDA is operated in partial mode. Voltage peaks only occur if the sampled signal is above the minimum level of the parallel A/D converter. Otherwise, as already described, the output of the reference D/A converter is shut off by the first noise suppression circuit NG1.

The partial value A/D converter AD forms the least significant bits of the digitalized audio signal from the difference signal. A 16-bit converter (e.g. PCM 75) is used. During the remaining period of a work cycle of 13 $\mu$sec, the difference signal is converted to the partial value. The voltage range at the input of the partial value A/D converter AD for the difference signal is set at a quarter of the voltage range of the audio signal. This corresponds to an amplification factor of 4. Together with the amplification factor of 4 of the operational amplifier in the difference amplifier DV, a total amplification factor of 16, or 24 dB, is achieved in the analog range. By shifting the digital partial value, a further amplification of 6 dB is achieved, since the 16th bit (MSB) is used for error correction. The next lower bit (i.e. the 15th bit of the partial value converter AD) is bit 6 of the 20-bit output at the temporary memory L.

The main task of the correction circuit KS is to add the most significant bit of the partial value A/D converter AD to the least significant bit of the parallel A/D converter FAD. This correction bit contains all the errors which could occur in the parallel conversion of the sampled signal. When using a binary adder (e.g. 74LS283), the output signal would have to be limited digitally in order to prevent the value range from being exceeded. By using a programmable read-only memory (e.g. AM27S29), the result of the addition is checked for a value over-run and lowered to the maximum value (hex3F), if necessary. In addition, an overload value is then generated. If the output of the parallel A/D converter indicates that the value has gone below the minimum quantization level (hex1F), the first noise suppression circuit NG1 is activated via the correction circuit.

In the temporary memory L (e.g. $3 \times$LS374), the partial value and the reference value are brought together to yield the 20-bit output value. The 5-bit reference value forms the most significant bits of the output value, while the 15-bit partial value forms the least significant bits of the output value. In addition, the overload value is balanced.

FIG. 2 shows the digital/analog converter module, which converts a 20-bit input value to an analog audio signal. The input value is sent to an input memory L1 by a data bus DB, and passed on to a transmission memory L2. This guarantees simultaneous data conversion in multi-channel systems. The reception and transmission memories are composed of D-flip-flops (e.g. each being $3 \times$74LS374). From the transmission memory L2, the eight most significant bits are transmitted in inverted form to a high-value D/A converter MS-DAC as an approximation of the input value. The twelve least significant bits are passed directly to a low-value D/A converter LS-DAC.

Inexpensive converters (e.g. FCM 54 KP) are used as the low-value and high-value D/A converters LS-DAC and MS-DAC. As a result, a high-performance, linear 20-bit digital/analog converter module with a working frequency up to four times the sampling rate of 48 kHz can be formed. Before the outputs of the low-value and high-value D/A converter LS-DAC and MS-DAC are added, the levels must be adjusted in such a way that the value of the highest bit of the low-value D/A converter LS-DAC is half the value of the lowest bit of the high-value D/A converter MS-DAC. This means that the partial signal at the output of the low-value D/A converter LS-DAC must be attenuated by 48 dB. This takes place in two steps. In the first step, the digital input value of the low-value D/A converter is shifted downward four bits, which corresponds to an attenuation of 24 dB. The remaining attenuation takes place during the current-voltage conversion of the analog partial signal.

Since the voltage output of the converter types used have a high noise level, which is partly caused by the internal current-voltage amplifier, low-noise operational amplifiers (e.g. NE 5532) are used externally for current-voltage conversion. By the use of a second amplifier step with an inverting operational amplifier to virtual ground, the output voltage of the high-value D/A converter MS-DAC is increased by 19.2 dB in a summation amplifier, while it is lowered by 4.8 dB in the low-value D/A converter LS-DAC. This completes the precise level adjustment of both partial signals. The formation of the sum takes place in a low-noise operational amplifier (e.g. NE 5532) with an amplification factor of 2.5 dB.

Temperature variations in the current-voltage conversion and summation, and aging of the components used, trigger audible distortions in signals at a lower level. To eliminate this source of error, a second noise suppression circuit NG2 is used. A digital fixed value (digital offset), which corresponds to a direct current, is added to the input value before the input memory L1, which causes the voltage zero pause of the converters not to be connected with a polarity change of the input value. Interference, such as that which occurs during simultaneous reversal of all 20 bits, is avoided. The zero pause is increased greatly for processing of the audio signals (hex 355). The digital fixed value also lowers the noise level, which is generated by the digital/analog conversion in the converter. A NAND gate G with eight inputs (e.g. 74LS30) is connected with the eight bits of the partial value of the high-value D/A converter MS-DAC. The second noise suppression circuit NG2, which is structured as a voltage splitter and composed of a resistor (390 Ohm) and a field effect transistor (e.g. J 110) is controlled with this gate G. For input values lower than the digital fixed value (hex 355), the field effect transistor is turned on via the gate G, and the output of the high-value D/A converter MS-DAC is attenuated by approximately 30 dB. Conversion only takes place via the low-value D/A converter LS-DAC, the output of which is always attenuated by 24 dB. Its noise level therefore does not represent a problem. Due to the second noise suppression circuit NG2, the dynamic range of the entire digital/analog converter module becomes greater than 122 dB. The partial value at the input of the high-value D/A converter MS-DAC is inverted. In order to maintain the performance capability of the module even at higher signal levels, only components with low temperature coefficients should be used.

After passing through the summation amplifier SV, the sum signal is passed to an equalizing filter DG to remove voltage peaks. After passing through an output filter AIF with (sin x)/x compensation, the level of the output signal can still be adjusted by an inverting operation amplifier, if necessary.

This circuit uses relatively inexpensive 16-bit converters and other common and therefore easily available components to make a 20-bit converter, which yields very good results for audio purposes. It is also suitable for over-sampling.

What is claimed is:

1. A method for converting a sampled signal of an analog input signal to a digital output signal that is L data bits in length comprising the steps of:
    converting the sampled signal to a digital reference signal of $M<L$ data bits in length only during a sampling period that is a portion of a work cycle;
    maintaining said digital reference signal until a subsequent sampling period;
    converting the digital reference signal back to an analog reference signal;
    subtracting the analog reference signal from the sampled signal to form a difference signal, said subtracting being suppressed if a level of the sampled signal falls below a minimum quantization level for converting the sampled signal to a digital reference signal;
    amplifying and converting the difference signal to a digital partial signal of N data bits in length, where $M<N<L$; and
    summing the digital reference signal and the signal partial signal to yield the digital output having L data bits, said output signal having most significant bits formed by the digital reference signal and least significant bits formed by the digital partial signal, wherein a sum of a number of data bits of the digital reference signal and the partial signal is not less than a number of data bits of the digital output signal.

2. The method of claim 1 wherein the sum of the data bits of the digital reference signal and the digital partial signal is not substantially greater than the number of data bits of the digital output signal and further comprising the steps of correcting conversion errors with excess data bits and indicating with said excess data bits that a value range is exceeded.

3. A method for converting a digital input signal having most significant and least significant bits to an analog output signal comprising the steps of:
    dividing the digital input signal into two partial values, the most significant bits forming a higher partial value and the least significant bits forming a lower partial value;
    shifting the lower partial value downward several bits to achieve a first portion of a level adjustment;
    converting simultaneously the higher and lower partial values to higher and lower analog partial signals, respectively, the higher partial value having a first number of bits and the lower partial value having a second number of bits, the first number of bits being less than the second number of bits;
    attenuating the lower partial signal to achieve a remaining portion of the level adjustment with respect to the higher partial signal;
    adding a fixed digital signal to the digital input signal and attenuating the higher partial signal to a corresponding degree if the digital input signal is less than the digital fixed signal; and
    summing the lower and higher partial signals to form the analog output signal.

4. An apparatus for analog to digital conversion comprising:
- a sampling and holding element having an output and an input for receiving an input signal;
- an M-bit parallel A/D converter having an analog input coupled to said output of the sampling and holding element;
- a reference D/A converter having digital inputs coupled to outputs of the parallel A/D converter;
- an L-bit bistable temporary memory, where M<L, having high-value inputs coupled to said outputs of the parallel A/D converter;
- a difference amplifier coupled to an output of the reference D/A converter and coupled to said output of the sampling and holding element;
- an N-bit partial value A/D converter, where M<N<L, having an analog input coupled to an output of the difference amplifier and having outputs coupled to low-value inputs of the temporary memory and also having a highest-value output;
- a correction circuit having inputs coupled to said outputs of the M-bit parallel A/D converter and having an additional input coupled to said highest-value output of the partial value A/D converter, said correction circuit having outputs coupled to said high-value inputs of the temporary memory and having an overload output coupled to another input of the temporary memory; and
- a first noise suppression circuit coupled to a control output of the correction circuit, said first noise suppression circuit coupled to the reference D/A converter and the difference amplifier to suppress a reference signal when a level of the sampling signal is below a minimum quantization level for forming the reference signal.

5. An apparatus for digital to analog conversion comprising:
- a data bus for receiving a digital input signal, said data bus having highest-value lines;
- a low-value and a high-value D/A converter coupled to the data bus, said low-value and high-value D/A converters each having an output;
- a summation amplifier coupled to said output of the low-value D/A converter and to said output of the high-value D/A converter;
- a noise suppression circuit coupled to said output of the high-value D/A converter and coupled to the summation amplifier;
- a gate coupled to said noise suppression circuit and said highest-value lines of the data bus for adding a digital fixed signal; and
- a transmission memory and an input memory serially coupled together, said input memory coupled to said data bus and said transmission memory having high-value outputs coupled to the high-value D/A converter and having low-value outputs coupled to the low-value D/A converter.

* * * * *